| (12) | United States Patent | (10) Patent No.: | US 12,176,316 B2 |
|---|---|---|---|
| | Raimann et al. | (45) Date of Patent: | Dec. 24, 2024 |

(54) HALF-BRIDGE MODULE FOR AN INVERTER OF AN ELECTRIC DRIVE OF AN ELECTRIC VEHICLE OR A HYBRID VEHICLE AND AN INVERTER FOR AN ELECTRIC DRIVE OF AN ELECTRIC VEHICLE OR A HYBRID VEHICLE

(71) Applicant: ZF Friedrichshafen AG, Friedrichshafen (DE)

(72) Inventors: Manuel Raimann, Salem (DE); Ivonne Trenz, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 512 days.

(21) Appl. No.: 17/212,973

(22) Filed: Mar. 25, 2021

(65) Prior Publication Data

US 2021/0313296 A1 Oct. 7, 2021

(30) Foreign Application Priority Data

Apr. 3, 2020 (DE) .......................... 102020204358.2

(51) Int. Cl.
*H01L 23/00* (2006.01)
*H01L 23/498* (2006.01)
(Continued)

(52) U.S. Cl.
CPC ........ *H01L 24/73* (2013.01); *H01L 23/49838* (2013.01); *H01L 24/37* (2013.01); (Continued)

(58) Field of Classification Search
None
See application file for complete search history.

(56) References Cited

U.S. PATENT DOCUMENTS

| 2009/0140414 A1* | 6/2009 | Soyano | .................... H01L 24/40 |
|---|---|---|---|
| | | | 257/E23.142 |
| 2013/0285235 A1* | 10/2013 | Murata | ................. H01L 23/373 |
| | | | 257/712 |
| 2017/0309539 A1* | 10/2017 | Weißmann | ............ G01J 5/0007 |

FOREIGN PATENT DOCUMENTS

| DE | 102006050291 | 5/2007 |
|---|---|---|
| DE | 102006008632 | 8/2007 |

(Continued)

OTHER PUBLICATIONS

Search Report issued in German Patent Application No. DE102020204358.2 dated Oct. 27, 2020 (10 pages).

*Primary Examiner* — Michelle Mandala
*Assistant Examiner* — Jordan M Klein
(74) *Attorney, Agent, or Firm* — Crowell & Moring LLP

(57) ABSTRACT

The invention relates to a half-bridge module for an inverter in an electric drive for an electric vehicle or a hybrid vehicle, comprising a substrate, semiconductor switches arranged on the substrate, power connections, and signal connections, wherein the signal connections are electrically connected to the semiconductor switches such that the semiconductor switches can be switched via the signal connections, and wherein the power connections are electrically connected to the semiconductor switches such that the semiconductor switches allow or interrupt electricity transmission between the power connections. The half-bridge module according to the invention is distinguished in that the semiconductor switches are in electrical contact in part via bond wires and in part via lead frames. The invention also relates to a corresponding inverter.

20 Claims, 2 Drawing Sheets

Figure 1:
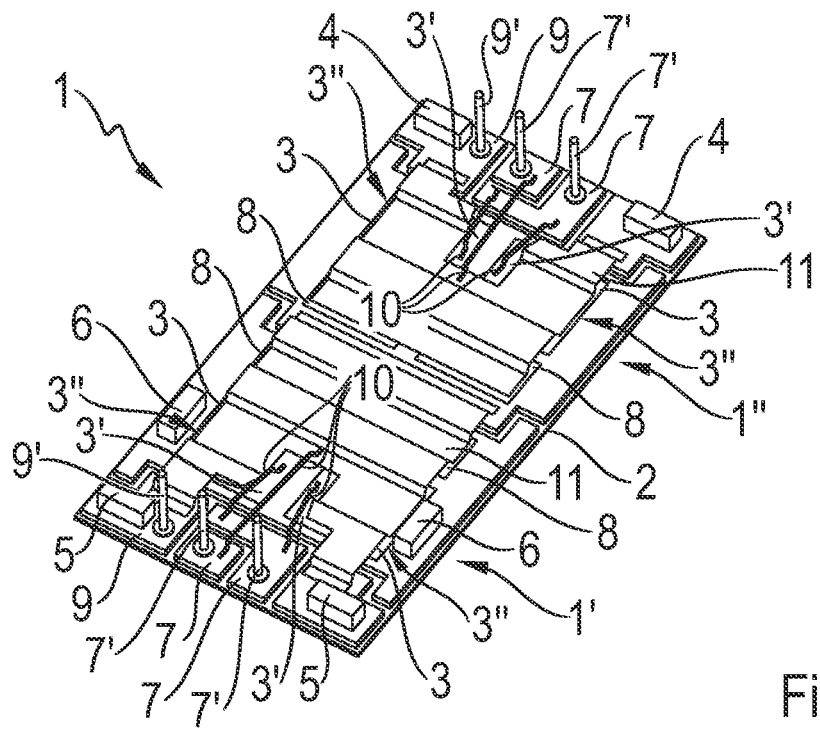

(51) Int. Cl.
*H01L 25/07* (2006.01)
*H01L 25/18* (2023.01)
*H02M 7/00* (2006.01)

(52) U.S. Cl.
CPC ............ *H01L 25/072* (2013.01); *H01L 25/18* (2013.01); *H02M 7/003* (2013.01); *H01L 24/40* (2013.01); *H01L 24/48* (2013.01); *H01L 2224/37012* (2013.01); *H01L 2224/40225* (2013.01); *H01L 2224/48225* (2013.01); *H01L 2224/73221* (2013.01); *H01L 2924/10272* (2013.01); *H01L 2924/1203* (2013.01); *H01L 2924/13055* (2013.01); *H01L 2924/13091* (2013.01)

(56) References Cited

FOREIGN PATENT DOCUMENTS

| | | |
|---|---|---|
| DE | 102008060300 | 6/2009 |
| DE | 102015012915 | 4/2017 |

* cited by examiner

HALF-BRIDGE MODULE FOR AN INVERTER OF AN ELECTRIC DRIVE OF AN ELECTRIC VEHICLE OR A HYBRID VEHICLE AND AN INVERTER FOR AN ELECTRIC DRIVE OF AN ELECTRIC VEHICLE OR A HYBRID VEHICLE

This application claims priority from German Application No. DE102020204358.2, filed on Apr. 3, 2020, the entirety of which is hereby fully incorporated by reference herein.

The invention relates to a half-bridge module for an inverter in an electric drive for an electric vehicle or a hybrid vehicle as disclosed herein, and a corresponding inverter.

Both purely electric vehicles and hybrid vehicles are known from the prior art, which are powered exclusively or partially by one or more electric machines in the form of drive assemblies. To supply the electric machines in these electric or hybrid vehicles with electrical energy, the electric and hybrid vehicles comprise electric energy storage units, in particular rechargeable electric batteries. These batteries form DC voltage sources, although the electric machines normally require AC voltage. For this reason, there is normally a power electronics with a so-called inverter interconnected between a battery and an electric machine in an electric or hybrid vehicle.

These inverters normally comprise semiconductor switches, usually formed by transistors. These semiconductor switches have different degrees of integration, either as discrete individual switches with a low degree of integration but high level of scalability, bridge modules with a high degree of integration but lower scalability, or as half-bridge modules, ranging between the individual switches and the bridge modules with regard to the degree of integration and scalability. Three half-bridge modules typically form an inverter, such that the inverter has three phases.

An electronic module is disclosed in DE 10 2006 050 291 A1, which comprises a semiconductor power switch and a semiconductor diode. A lower surface of the semiconductor power switch comprises an output contact mounted on a chip field on a carrier strip, and an upper surface of the semiconductor power switch comprises a control contact and an input contact. An anode contact on the semiconductor diode is located on the input contact on the semiconductor power switch and electrically connected thereto. A cathode contact on the diode is electrically connected to the output contact on the semiconductor power switch.

DE 10 2006 008 632 A1 discloses a semiconductor power component that comprises a flat lead frame, at least one vertical semiconductor power component, and at least one more electronic component. The vertical semiconductor power component has a first side and a second side. At least one first contact surface and at least one control contact surface are located on the first side, and a second contact surface is located on the second side. The at least one more electronic component is located on the second contact surface on the vertical semiconductor power component.

A semiconductor module that has at least one first semiconductor element is known from DE 10 2015 012 915 A1, which has a first side with at least one first electrode, and a second side with at least one second electrode, and has at least one second semiconductor element that has a first side with at least one first electrode and a second side with at least one second electrode. The first semiconductor element is located above the second semiconductor element, and an electrically conductive connection is located between the first semiconductor element and the second semiconductor element, wherein the at least one second electrode on the first semiconductor element is mechanically and electrically connected to the electrically conductive connection, and the at least one first electrode on the second semiconductor element is mechanically and electrically connected to the electrically conductive connection.

A half-bridge module is known form the not yet published DE 10 2019 220 010.9 by the applicant, in which the signal connections and the power connections are all located on the same side of the substrate and encompassed in a casting compound. The power connections and the signal connections can all be accessed from the same side of the substrate such that the power connections and signal connections extend through the casting compound, seen from the same side of the substrate, and are located within a base surface spanning the substrate, seen from the direction in which they pass through the casting compound.

Depending on the actual arrangement of the semiconductor switches on the underlying substrate, the known inverters have numerous disadvantages, e.g. poor heat dissipation, uneven current distribution, or they require a large installation space. An improved heat dissipation normally requires a higher installation space, and a smaller installation space normally results in poorer heat dissipation. Likewise, a more even current distribution results in poorer heat dissipation or likewise, a higher installation space requirement, and vice versa. The inductive properties of the inverter resulting from the selected arrangement of the semiconductor elements must also be taken into account.

The object of the invention is to propose an improved half-bridge module for an inverter in an electric drive for an electric or hybrid vehicle.

This object is achieved according to the invention by the half-bridge module for an inverter in an electric drive for an electric or hybrid vehicle as disclosed herein. Advantageous embodiments and developments of the invention can also be derived from the instant disclosure.

The invention relates to a half-bridge module for an inverter in an electric drive for an electric or hybrid vehicle comprising a substrate, semiconductor switches, power connections and signal connections located on the substrate, wherein the signal connections are electrically connected to the semiconductor switches such that the semiconductor switches can be switched via the signal connections, and wherein the power connections are electrically connected to the semiconductor switches such that the semiconductor switches allow or interrupt an electrical power transfer between the power connections. The half-bridge module according to the invention is distinguished in that the semiconductor switches are electrically contacted in part via bond wires and in part via lead frames.

According to the invention, a half-bridge module is provided that is designed for use in an inverter, wherein the inverter is used for supplying an electric motor with AC current in an electric or hybrid vehicle. The half-bridge module comprises a substrate, which can be a DBC (Direct Bonded Copper) substrate, AMB (Active Metal Brazing) substrate, or IM (Insulated Metal) substrate. Semiconductor switches, as well as the associated power connections and signal connections, in particular transistors and diodes, are located on substrate. The substrate is preferably rectangular, having two pairs of opposing side edges. The substrate can also be square. The signal connections are used for switching the semiconductor elements and are electrically connected to a signal contact on the semiconductor switch. Depending on the design of the semiconductor switch, the semiconductor switch can be switched between on and off by providing current to the signal contact or subjecting the switching surface to a voltage. The power connections are electrically connected to power contacts on the semiconductor switches, such that electricity can be transferred from one power connection, through a semiconductor switch, to another power connection. The electricity supplied to the electric motor for powering the electric vehicle or hybrid vehicle is provided via the power connections. In particular, there are different types of power connections, specifically positive connections, negative connections, and phase connections, wherein the positive connections are used to supply electrical current, and the negative connections are used to discharge electrical current. The phase connections provide the actual AC voltage power supply for the electric motor. The positive connections and the negative connections are preferably located near side edges of the substrate, i.e. the negative connections are located near the shorter side edges of the substrate, and the positive connections are located near the longer side edges. The half-bridge module preferably comprises two positive connections and two negative connections, although there can be more than just two positive connections and negative connections, in order to be able to conduct higher currents, for example. The phase connections are preferably located opposite the negative connections, and likewise near a shorter side edge of the substrate. The power connections and the signal connections in the half-bridge module according to the invention can all be accessed from the same side of the substrate, preferably the upper surface. This means that the power connections and the signal connections extend through the casting compound from the same side of the substrate, and are located within a base surface spanning the substrate seen from the direction they pass through the casting compound. This makes it possible to arrange the power connections in relation to one another such that the half-bridge module has low leakage inductance in the commutation cell in the order of a few nanohenrys, as well as low leakage inductances in the signal connections. Both result in switching with low losses. Another advantage of this design of the power connections and signal connections is that they no longer extend sideways, such that they are positioned outside the base surface spanning the substrate. This results in advantages regarding installation space.

According to the invention, the semiconductor switches are electrically contacted in part via bond wires and in part via lead frames, i.e. the signal contacts are electrically connected with the signal surfaces and the power connections are electrically connected to the power surfaces in part via bond wires and in part via lead frames. This has the advantage of a very flexible arrangement for the semiconductor switches on the substrate, and therefore reducing or avoiding the aforementioned disadvantages in the prior art, such that, in particular the relationship between current distribution, installation space requirements, and heat dissipation can be at least partially opened up, such that an optimization of one of these properties leads only to a slight or no degradation of the other two properties. Because lead frames enable a comparatively even current distribution, and facilitate conductance of higher currents, they are less flexible, and limit the flexibility of the arrangement of the semiconductor switches due to their structure. In contrast, bond wires are more flexible, and therefore also enable a flexible arrangement of the semiconductor switches on the substrate. With regard to the possibility of ensuring an even current distribution, they are more limited. As a result of the combination of electric contacts on the semiconductor switches, in part with bond wires and in part with lead frames, provided according to the invention, the advantages of both contact possibilities can be combined on a half-bridge module.

A bond wire can have an appropriate diameter and be made of an appropriate material for the amperage that is to be conducted therewith. The bond wire also does not have to have a round cross section, e.g. copper with a diameter of 0.5 mm to 2.0 mm. Rectangular or square cross sections can also be used.

The lead frames are stamped from sheet metal, and exhibit a suitable thickness and material for the amperage that is to be conducted. The lead frames preferably have a three dimensional profile, i.e. there are rises generated by bending, preferably located between two semiconductor switches or power connections that are to be connected, and depressions caused by bending, preferably for contact with semiconductor switches or power connections. Each lead frame is a single element, and can connect numerous semiconductor components and power connections to one another. In particular because of the comparatively large surface area and single element construction, as well as the resulting lack of connecting points within a lead frame, a particularly even current distribution is also obtained.

The semiconductor switches on the substrate of the half-bridge module and the bond wires and lead frames are advantageously coated with a casting compound. This protects the semiconductor module from environmental effects, and in particular from mechanical damages.

According to a preferred embodiment of the invention, the signal contacts on the semiconductor switches are electrically contacted via bond wires. Because the signal contacts are not normally subjected to high amperages, or only require a voltage, and an even distributability of the current therefore plays no, or only an insignificant, role, a reliable switching of the semiconductor switches can also be ensured by the electric contacts obtained with a bond wire, wherein the bond wire is also flexible enough that it can be arranged, e.g., around a lead frame, or above a lead frame, thus never limiting the arrangements of the less flexible lead frames. The possibilities for the spatial and geometric arrangement of lead frames are therefore not limited.

According to another preferred embodiment of the invention, the power contacts on the semiconductor switches are electrically contacted via lead frames. This has the advantage that the preference for lead frames, with regard to their even current distribution and their good conductivity, in conjunction with the high amperages to be supplied to or discharged from the power contacts, can normally conduct higher amperages. If the signal contacts are in electrical contact via bond wires, because of the flexibility of the bond wire, there is nearly no need for concern regarding the electrical contact to the signal contacts, such that the lead frames can be designed exclusively according to the requirements for an optimized current distribution, heat dissipation, and installation space reduction. Lead frames also enable a full surface contact with the power contacts, resulting not only in low electrical resistances and an improved charge carrier distribution in the semiconductor switches, but also in heat dissipation from the semiconductor switches to the lead frames, and from the lead frames into the environment.

According to a particularly preferred embodiment of the invention, the lead frames are wider than the semiconductor switches, at least in part. This results in a supplying and discharging of electrical power to or from the semiconductor switches with the lowest possible resistance. Because of the enlarged surface area, the heat dissipation from the semiconductor switches via the lead frames into the environment is improved.

According to another particularly preferred embodiment of the invention, the half-bridge module comprises a high-side circuit and a low-side circuit, wherein the high-side circuit has exactly one dedicated lead frame, and the low-side circuit has exactly one dedicated lead frame. The half-bridge module is therefore comprised of two sub-circuits, specifically the high-side circuit and the low-side circuit. The positive connections are assigned to the high-side circuit, and the negative connections are assigned to the low-side circuit. Both the low-side circuit and the high-side circuit can be connected electrically to the phase connections. In that both the high-side circuit and the low-side circuit each have just one dedicated lead frame, the lead frames can have a relatively large surface area, i.e. with a comparatively large width and length. This further improves the conductivity and heat dissipation.

According to another particularly preferred embodiment of the invention, the lead frames are designed such that their geometric form contains a U. This embodiment has proven to be substantially optimal, because there is only a recess in the region of the ends of the "U", or between the legs of the "U," which allows bond wires to be attached to the signal connections. Otherwise, the lead frames can exhibit a maximum length, width, or surface area.

According to another particularly preferred embodiment of the invention, the semiconductor switches form insulated-gate bipolar transistors and/or silicon carbide metal-oxide-semiconductor field-effect transistors. Insulated-gate bipolar transistors are generally known as so-called IGBTs, and silicon carbide metal-oxide-semiconductor field-effect transistors are known in general as so-called SiC-MOSFETs. These types of semiconductor switches are comparatively suitable for low-loss and quick switching, and for high currents.

According to a particularly preferred embodiment of the invention, each insulated-gate bipolar transistor has a dedicated free-wheeling diode. The free-wheeling diodes protect their dedicated insulated-gate bipolar transistors from inductive voltage surges, in particular when switching electrical powers.

According to another preferred embodiment of the invention, the semiconductor switches are arranged in a plane on an upper surface of the substrate. This has the advantage of even better heat dissipation.

According to another preferred embodiment of the invention, each semiconductor switch is geometrically and electrically arranged in relation to a power connection identically to at least one other semiconductor switch in relation to another power connection. This means that the half-bridge module has one or more axes of symmetry, or a point of symmetry, at which arrangements of semiconductor switches and power connections are mirrored. By way of example, a first semiconductor switch can be electrically connected to a positive connection via a lead frame or a segment of a lead frame, and a second semiconductor switch can be electrically connected to another positive connection via a geometrically identical lead frame or geometrically identical segment of a lead frame. As a result, both electrical connections have the same resistance. A third and fourth semiconductor switch can also be electrically connected to two negative connections via a geometrically identical, potentially mirror reversed, lead frame, or geometrically identical, potentially mirror reversed, segment of a lead frame. This symmetry results in a very uniform current distribution.

According to another preferred embodiment of the invention, the half-bridge module comprises two additional electrical connections, the electric connection of which to the half-bridge module is configured as a return line for a control current. With an insulated-gate bipolar transistor, one of the additional electrical connections is used as a so-called Kelvin emitter, and with a silicon carbide metal-oxide-semiconductor field-effect transistor, one of the additional electrical connections is used as a so-called Kelvin source. Both the Kelvin emitter and the Kelvin source serve as return lines for a control current. The retroactive effects of the load current to the control current are minimized by this type of contact. Furthermore, a power connection in conjunction with one of the two additional electrical contacts can be used for inductive short circuit detection. The voltage drop between the power connection and the additional electrical connection is preferably measured for this.

The control current is sent to the signal contacts for the semiconductor component, and switches the semiconductor component either on or off.

The invention also relates to an inverter for an electric drive in an electric vehicle or a hybrid vehicle, comprising at least three half-bridge modules according to the invention. The advantages described above in conjunction with the half-bridge module according to the invention are therefore also obtained for the inverter according to the invention.

The invention shall be explained below by way of example, based on the embodiments shown in the figures.

Figure 2:
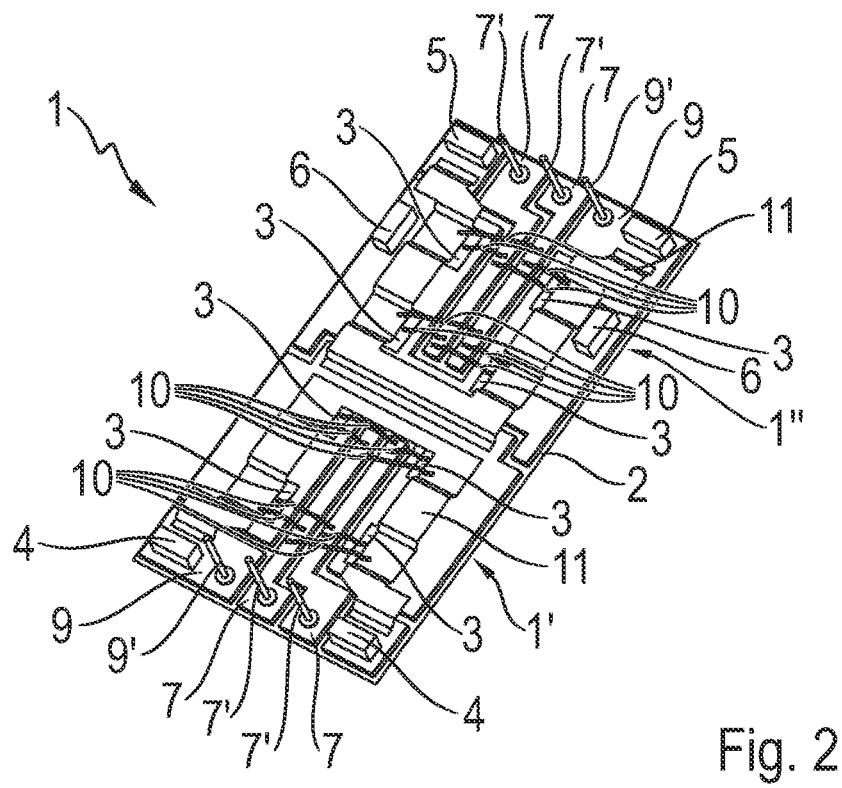
Figure 3:
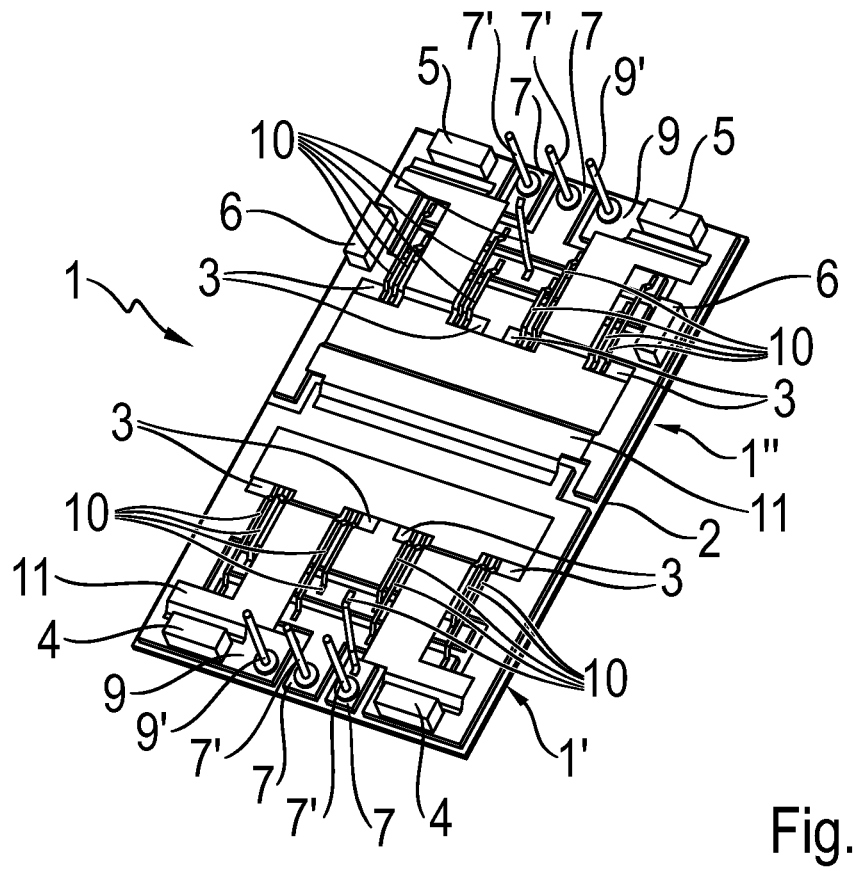
Figure 4:
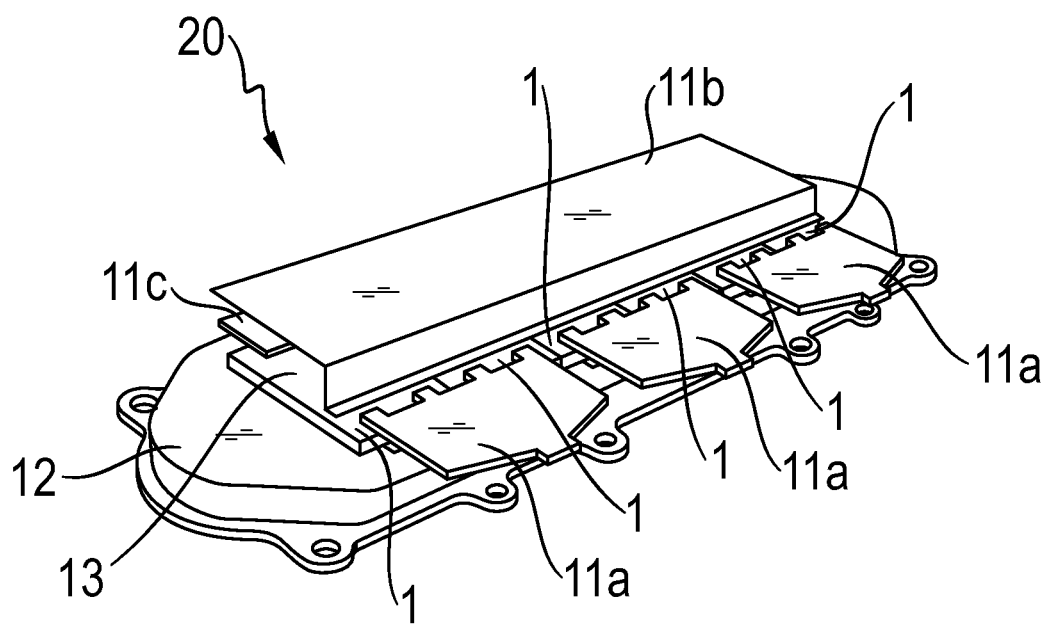

Therein:

FIG. 1 shows, by way of example and schematically, a first possible embodiment of a half-bridge module according to the invention for an inverter in an electric drive for an electric vehicle or a hybrid vehicle, FIG. 2 shows, by way of example and schematically, a second possible embodiment of a half-bridge module according to the invention for an inverter in an electric drive for an electric vehicle or a hybrid vehicle, FIG. 3 shows, by way of example and schematically, a third possible embodiment of a half-bridge module according to the invention for an inverter in an electric drive for an electric vehicle or a hybrid vehicle, FIG. 4 shows, by way of example and schematically, a possible embodiment of an inverter according to the invention for a power electronics in an electric vehicle or a hybrid vehicle.

The same objects, functional units, and comparable components have the same reference symbols throughout the figures. These objects, functional units and comparable components are identical with regard to their technical features, as long as not otherwise specified, explicitly or implicitly, in the description.

FIG. 1 shows, by way of example and schematically, a first possible embodiment of a half-bridge module 1 according to the invention for an inverter 20 in an electric drive for an electric vehicle or hybrid vehicle. The half-bridge module 1 is composed of a high-side circuit 1' and a low-side circuit 1". It comprises a substrate 2 in the form of a DBC (Direct Bonded Copper) substrate 2 with a ceramic carrier plate and copper coating on both sides, as well as semiconductor switches 3, freewheeling diodes 8, power connections 4, 5, 6, and signal connections 7, wherein the signal connections 7 each have a signal connection contact pin 7'. The copper coating is structured in numerous separate sections. The half-bridge module 1 also comprises two additional electric connections 9, the electrical connection to the half-bridge module 1 for which is designed to enable a so-called Kelvin sensing. This minimizes the retroactive effects of the load current to the control current. Furthermore, inductive short circuit detection is enabled via a power connection in conjunction with one of the two additional electrical connections. The voltage drop between the power connection and the additional electrical connection is preferably measured for this. Contact can be made to the two additional electrical connections 9 via an additional electric contact pin 9' provided for this. The power connections 4, 5, 6 form positive connections 6, negative connections 4, and phase connections 5, and at least the positive connections 6 and the phase connections 5 are electrically connected to the semiconductor switches 3 via lead frames 11, such that the semiconductor switches 3 allow or interrupt electrical power transfer between the power connections 4, 5, 6. The lead frames 11 can contain power contacts 3" on the upper surface of the semiconductor switches 3 for this. As can be seen in the illustration, the lead frames 11 exhibit a greater width in at least one longitudinal middle section of the half-bridge module 1 than the semiconductor switch 3. Both the high-side circuit 1' and the low-side circuit 1" are assigned to exactly one lead frame 11, wherein each lead frame 11 is configured such that its geometric form contains a U. This results in comparatively low electrical resistances in the lead frames 11 and an even current distribution in the half-bridge module 1. The signal connections 7 are electrically connected to the semiconductor switches 3 such that the semiconductor switches can be switched via the signal connections 7. These signal connections 7 are electrically connected to signal contacts 3' in the semiconductor components 3 via bond wires 10, and electrically connected to the lead frames 11 via other bond wires 10, such that an electrical switching current sent to the signal contacts 3' on the semiconductor switches 3 can be returned via the power contacts 3" and the lead frames 11. The semiconductor switches 3 are designed as insulated-gate bipolar transistors according to this example, also known as insulated-gate bipolar transistors (IGBT). Each insulated-gate bipolar transistor 3 has a dedicated freewheeling diode 8, for example, in order to protect the insulated-gate bipolar transistors 3 from inductive voltage surges when switching on electricity, which would otherwise destroy the insulated-gate bipolar transistors 8.

FIG. 2 shows, by way of example and schematically, a second possible embodiment of a half-bridge module 1 according to the invention for an inverter 20 in an electric drive for an electric vehicle or a hybrid vehicle. The half-bridge module 1 in FIG. 2 differs from the half-bridge module 1 in FIG. 1 by the design for the semiconductor switches 3 as silicon carbide metal-oxide-semiconductor field-effect transistors 3, also known as siliciumcarbid metal oxide semiconductor field effect transistors (SiC MOSFET), instead of as insulated-gate bipolar transistors 3. As a result, there is no need for a freewheeling diode 8, but more silicon carbide metal-oxide-semiconductor field-effect transistors 3 are needed than insulated-gate bipolar transistors 3 for switching the same amperages. Accordingly, the half-bridge module in FIG. 2 contains eight semiconductor switches 3, instead of just four. The signal connections 7 and the geometric design of the lead frames 11 are adapted to this larger number of semiconductor switches 3, and just one lead frame 11 is used for the high-side circuit 1' and just one lead frame 11 is used for the low-side circuit 1". Each lead frame 11 is also designed such that its geometric form contains a U according to the exemplary embodiment in FIG. 2.

FIG. 3 shows, by way of example and schematically, a third possible embodiment of a half-bridge module 1 according to the invention for an inverter in an electric drive for an electric vehicle or a hybrid vehicle. The half-bridge module 1 in FIG. 3 differs from the half-bridge module 1 in FIG. 2 with regard to the geometry of the lead frames 1. As can be seen in the figure, the four silicon carbide metal-oxide-semiconductor field-effect transistors 3 in both the high-side circuit 1' and the low-side circuit 1" are geometrically and electrically identically arranged in relation to the power connections 4, 5, e.g. the negative connections 4 and the phase connections 5. As a result of this symmetry, the current distribution in the half-bridge module 1 is extremely uniform. The lead frames 1 are geometrically adapted to this arrangement of the semiconductor switches 3, and also exhibit a U contained in their geometric forms in this exemplary embodiment.

FIG. 4 shows, by way of example and schematically, a possible embodiment of an inverter 20 according to the invention for an electric drive in an electric vehicle or a hybrid vehicle. The inverter 20 comprises six half-bridge modules 1 according to this example, wherein each of the phase connections 5 are in contact with two half-bridge modules 1 via a third, shared busbar 11a. The positive connections 6 and the negative connections 4 are in contact with all six half-bridge modules 1 via a first shared busbar 11b, or a second shared busbar 11c. The half-bridge modules 1 are arranged on a cooling device 12 in the form of a water cooler via a sinter layer, not shown in FIG. 4. The half-bridge modules 1 are illustrated in FIG. 4 as encompassed in the casting compound 13, as described above.

REFERENCE SYMBOLS

- 1 half-bridge module
- 1' high-side circuit
- 1" low-side circuit
- 2 substrate
- 3 semiconductor switch, silicon carbide metal-oxide-semiconductor field-effect transistor, insulated-gate bipolar transistor
- 3' signal contact
- 3" power contact
- 4 power connection, negative connection
- 5 power connection, phase connection
- 6 power connection, positive connection
- 7 signal connection
- 7' signal connection contact pin
- 8 freewheeling diode
- 9 additional electrical connection
- 9' additional electrical contact pin
- 10 bond wire
- 11 busbar
- 11a third busbar
- 11b first busbar
- 11c second busbar
- 12 cooling device, water cooler
- 13 casing compound
- 20 inverter

The invention claimed is:

1. A half-bridge module for an inverter for an electric drive for an electric vehicle or a hybrid vehicle, comprising:
   a substrate having a plurality of side edges and a base substrate area including an outer border of the base substrate area delineated by the side edges of the substrate such that the base substrate area does not extend over any side edge of the substrate;

semiconductor switches arranged on the substrate;

power connections electrically connected to the semiconductor switches; and signal connections electrically connected to the semiconductor switches, wherein the semiconductor switches are configured to be switched via the signal connections and allow or interrupt electricity transmission between the power connections, wherein the signal connections and the power connections are all arranged on a same side of the substrate, and covered by a casting compound, wherein the power connections and the signal connections are accessible from the same side of the substrate, such that the power connections and the signal connections extend through the casting compound and out of a top surface of the casting compound, as seen from the same side of the substrate, and wherein an entirety of each of the power connections and the signal connections are located within the base substrate area and do not extend outside of the base substrate area, as seen from the direction the power connections and the signal connections pass through and out of the casting compound, wherein the semiconductor switches are in electrical contact in part via bond wires and in part via lead frames.

2. The half-bridge module according to claim 1, wherein signal contacts on the semiconductor switches are electrically contacted via bond wires.

3. The half-bridge module according to claim 2, wherein the power contacts on the semiconductor switches are electrically contacted via the lead frames.

4. The half-bridge module according to claim 2, wherein the semiconductor switches are designed as at least one of insulated-gate bipolar transistors or silicon carbide metal-oxide-semiconductor field-effect transistors.

5. The half-bridge module according to claim 2, wherein the semiconductor switches are arranged in a planar configuration on an upper surface of the substrate.

6. The half-bridge module according to claim 2, wherein each semiconductor switch is arranged geometrically and electrically in relation to a power connection identically to at least one other semiconductor switch in relation to another power connection.

7. The half-bridge module according to claim 1, wherein the power contacts on the semiconductor switches are electrically contacted via the lead frames.

8. The half-bridge module according to claim 7, wherein, at least in sections, the lead frames are wider than the semiconductor switches.

9. The half-bridge module according to claim 8, wherein the half-bridge module comprises a high-side circuit and a low-side circuit, wherein the high-side circuit has exactly one dedicated lead frame and wherein the low-side circuit has exactly one dedicated lead frame.

10. The half-bridge module according to claim 8, wherein the lead frames are designed such that their geometric forms contain a U shape.

11. The half-bridge module according to claim 7, wherein the half-bridge module is for a single phase, wherein the half-bridge module comprises a high-side circuit and a low-side circuit for the single phase, wherein the high-side circuit has exactly one first dedicated lead frame and wherein the low-side circuit has exactly one second dedicated lead frame.

12. The half-bridge module according to claim 11, wherein the first and second lead frames are designed such that each of their geometric forms contain a U shape as seen from the direction the power connections and the signal connections pass through and out of the casting compound.

13. The half-bridge module according to claim 7, wherein the lead frames are designed such that their geometric forms contain a U shape.

14. The half-bridge module according to claim 13, wherein each semiconductor switch is arranged geometrically and electrically in relation to a power connection identically to at least one other semiconductor switch in relation to another power connection.

15. The half-bridge module according to claim 1, wherein the semiconductor switches are designed as at least one of insulated-gate bipolar transistors or silicon carbide metal-oxide-semiconductor field-effect transistors.

16. The half-bridge module according to claim 15, wherein each insulated-gate bipolar transistor has a dedicated freewheeling diode.

17. The half-bridge module according to claim 1, wherein the semiconductor switches are arranged in a planar configuration on an upper surface of the substrate.

18. The half-bridge module according to claim 1, wherein each semiconductor switch is arranged geometrically and electrically in relation to a power connection identically to at least one other semiconductor switch in relation to another power connection.

19. The half-bridge module according to claim 1, wherein the half-bridge module comprises two additional electrical connections, the electrical connection of which to the half-bridge module is configured to return a control current.

20. An inverter for an electric drive in an electric vehicle or a hybrid vehicle, comprising at least three half-bridge modules according to claim 1.

* * * * *